US006804565B2

(12) United States Patent
Eid

(10) Patent No.: US 6,804,565 B2
(45) Date of Patent: Oct. 12, 2004

(54) DATA-DRIVEN SOFTWARE ARCHITECTURE FOR DIGITAL SOUND PROCESSING AND EQUALIZATION

(75) Inventor: Bradley F. Eid, Greenwood, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 353 days.

(21) Appl. No.: 09/850,500

(22) Filed: May 7, 2001

(65) Prior Publication Data

US 2002/0181717 A1 Dec. 5, 2002

(51) Int. Cl.[7] .............................. H04B 1/00; H03G 3/00; G06F 17/00
(52) U.S. Cl. ........................... 700/94; 381/86; 381/381; 381/61
(58) Field of Search .......................... 381/86, 302, 103, 381/310, 307, 61, 119, 107; 700/94

(56) References Cited

U.S. PATENT DOCUMENTS

| 4,761,814 | A | | 8/1988 | Sugai et al. |
|---|---|---|---|---|
| 4,866,776 | A | | 9/1989 | Kasai et al. |
| 4,905,283 | A | | 2/1990 | Ishikawa et al. |
| 4,972,482 | A | | 11/1990 | Ishiguro et al. |
| 5,146,507 | A | | 9/1992 | Satoh et al. |
| 5,199,075 | A | | 3/1993 | Fosgate |
| 5,222,143 | A | | 6/1993 | Min |
| 5,337,196 | A | | 8/1994 | Kim |
| 5,386,473 | A | | 1/1995 | Harrison |
| 5,467,399 | A | | 11/1995 | Whitecar |
| 5,594,800 | A | | 1/1997 | Gerzon |
| 5,617,480 | A | * | 4/1997 | Ballard et al. ................. 381/98 |
| 5,727,067 | A | | 3/1998 | Iwamatsu |
| 5,727,068 | A | | 3/1998 | Karagosian et al. |
| 5,796,844 | A | | 8/1998 | Griesinger |
| 5,798,818 | A | | 8/1998 | Derderian et al. |
| 5,802,181 | A | | 9/1998 | Ozaki et al. |
| 5,862,228 | A | | 1/1999 | Davis |
| 5,870,480 | A | | 2/1999 | Griesinger |
| 5,983,087 | A | * | 11/1999 | Milne et al. ................. 455/149 |
| 6,144,747 | A | * | 11/2000 | Scofield et al. ............. 381/309 |
| 6,150,597 | A | * | 11/2000 | Kakishita et al. ......... 84/477 R |
| 6,157,725 | A | * | 12/2000 | Becker ........................ 381/86 |
| 6,332,026 | B1 | | 12/2001 | Kuusama et al. |
| 6,442,278 | B1 | | 8/2002 | Vaudrey et al. |
| 6,587,565 | B1 | | 7/2003 | Choi |
| 6,639,989 | B1 | | 10/2003 | Zacharov et al. |

FOREIGN PATENT DOCUMENTS

EP 1 067 680 A2 1/2001

OTHER PUBLICATIONS

Dolby Laboratories, Inc., "Surround Sound Past, Present, and Future," 1999, pp. 1–8.

* cited by examiner

Primary Examiner—Minsun Oh Harvey
Assistant Examiner—Laura A. Grier
(74) Attorney, Agent, or Firm—Brinks Hofer Gilson & Lione

(57) ABSTRACT

A digital sound processing design system for a vehicle audio system includes a computer and a design tool that is run by the computer. The design tool allows a user to define sound processing criteria that is stored in a template file. An audio signal processor is connected to the first and second real channel inputs of an audio source. Memory that is coupled to the audio signal processor stores the template file. The sound processing engine that is coupled to the audio signal processor and the memory reads the template file at run-time to obtain the sound processing criteria. The sound processing engine applies the sound processing criteria to the first and second real channel inputs. The design tool allows a user to create virtual channel inputs and outputs that are based, in part, on the first and second real channel inputs.

70 Claims, 7 Drawing Sheets

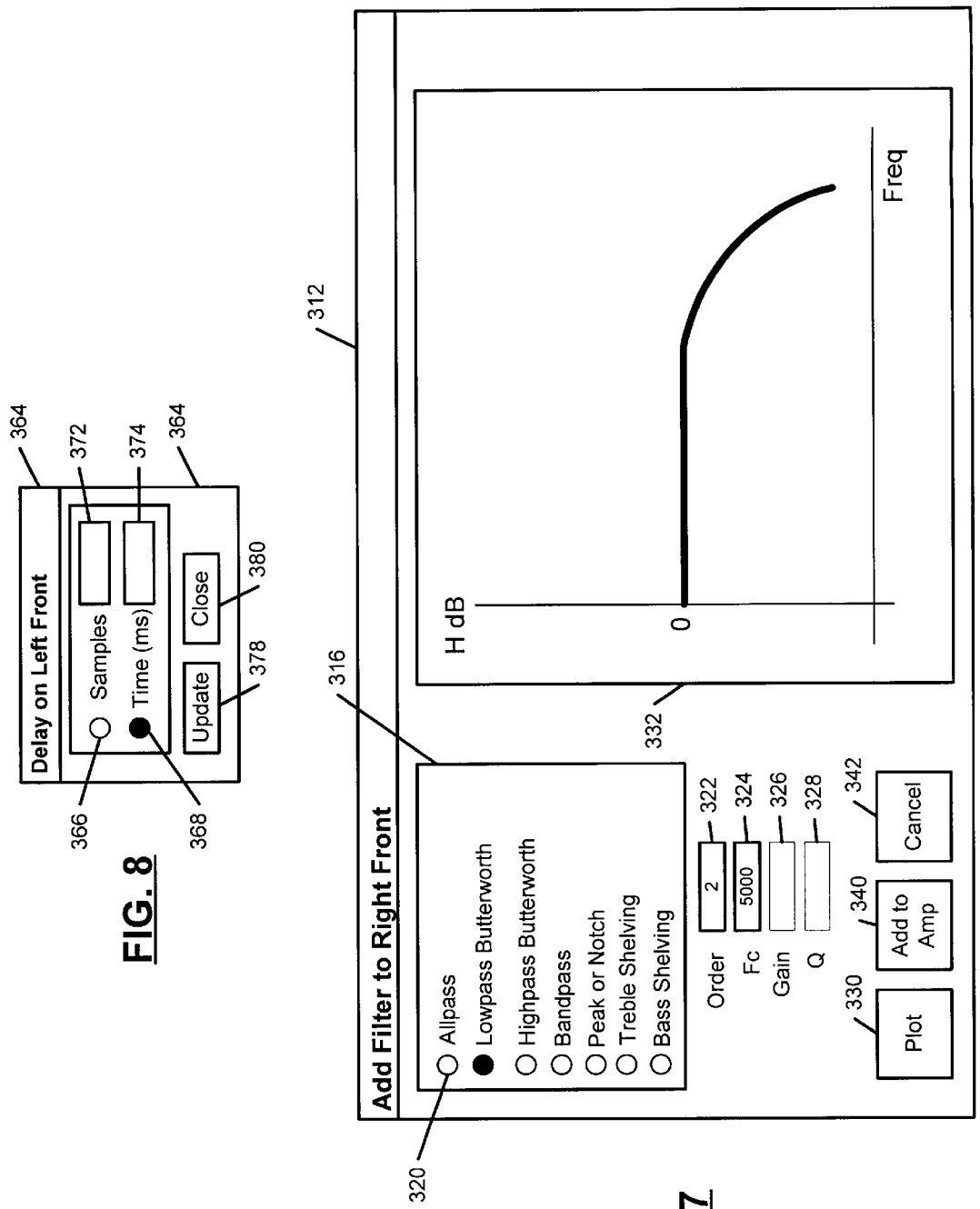

US 6,804,565 B2

DATA-DRIVEN SOFTWARE ARCHITECTURE FOR DIGITAL SOUND PROCESSING AND EQUALIZATION

FIELD OF THE INVENTION

This invention relates to sound processing and more particularly to digital sound processing and equalization of audio signals for vehicle audio systems.

BACKGROUND OF THE INVENTION

The design of audio systems for vehicles involves the consideration of many different factors. The audio system designer selects the position and number of speakers in the vehicle. The desired frequency response of each speaker must also be determined. For example, the desired frequency response of a speaker that is located on the instrument panel may be different than the desired frequency response of a speaker that is located on the lower portion of the rear door panel.

The audio system designer must also consider how equipment variations impact the audio system. For example, an audio system in a convertible may not sound as good as the same audio system in the same model vehicle that is a hard top. The audio system options for the vehicle may also vary significantly. One audio option for the vehicle may include a basic 4-speaker system with 40 watts amplification per channel while another audio option may include a 12-speaker system with 200 watts amplification per channel. The audio system designer must consider all of these configurations when designing the audio system for the vehicle. For these reasons, the design of audio systems is time consuming and costly. The audio system designers must also have a relatively extensive background in signal processing and equalization.

Consumer expectations of vehicle sound quality have dramatically increased over the last decade. Consumers now expect a very high quality sound system in their vehicles. In addition to high-quality audio from conventional sources such as radios, compact discs, and tape players, vehicle audio systems are being integrated with cellular phones, navigation systems, and video systems. Each of these additional audio sources have channel inputs and audio processing requirements that may be different than the stereo head unit. Some vehicle audio systems employ advanced signal processing techniques to customize the listening environment. For example, some vehicle audio systems incorporate matrix surround sound processing that is similar to surround sound offered in home theater systems.

Surround sound processors combine the left and right input signals in different proportions to produce two or more output signals. The various combinations of the input audio signals may be mathematically described by a N×2 matrix. The matrix includes 2N matrix coefficients that define the proportion of the left and/or right input audio signals for a particular output signal. In the more general case, surround sound processors can also transform N input channels into M output channels using a N×M matrix of coefficients. U.S. Pat. Nos. 4,796,844 and 5,870,480 to Greisinger, which are hereby incorporated by reference, disclose a surround sound system that provides 5 or 7 channels from left-right stereo inputs.

As can be appreciated from the foregoing, a sound processing and equalization design tool that assists audio system designers in integrating multiple audio sources would be desirable. Sound processing and design tools that allow audio system designers to create custom sound processing and equalization for vehicle audio systems would also be desirable. It would also be desirable to reduce the level of experience and the time required to design the vehicle audio systems.

SUMMARY OF THE INVENTION

A digital sound processing design system for a vehicle audio system according to the invention includes a computer and a design tool that is run by the computer. The design tool allows a user to define sound processing criteria that is stored in a template file. An audio signal processor is connected to first and second real channel inputs of an audio source. Memory that is coupled to the audio signal processor stores the template file. The sound processing engine that is coupled to the audio signal processor and the memory reads the template file at run-time to obtain the sound processing criteria. The sound processing engine applies the sound processing criteria to the first and second real channel inputs. The design tool allows a user to create virtual channel inputs and outputs that are based, in part, on the first and second real channel inputs.

In still other features of the invention, the sound processing criteria includes a speed/gain function that various a gain factor of at least one input channel as a function of vehicle's speed. Filter profiles can also be applied to at least one of the first and second real channel inputs. Other sound processing criteria include channel gain, vehicle identification selectors, audio source selectors, delay, etc.

Still other objects, features and advantages will be apparent to skilled artisans after reviewing the specification, the drawings, and the claims that follow.

BRIEF DESCRIPTION OF THE DRAWINGS

FIG. 7 is a first filter setting dialog box of the signal processing design tool of FIG. 4; and FIG. 8 is a second filter setting dialog box of the signal processing design tool of FIG. 4.

DETAILED DESCRIPTION OF THE PREFERRED EMBODIMENTS

The ensuing detailed description provides preferred exemplary embodiments only and is not intended to limit the scope, applicability or configuration of the present invention. Rather, the ensuing detailed description of the preferred exemplary embodiments will provide those skilled in the art with an enabling description for implementing the preferred exemplary embodiments of the present invention. It being understood that various changes may be made in the function and arrangement of the elements without departing from the spirit and scope of the invention as set forth in the appended claims.

A digital sound processing system for a vehicle audio system according to the invention includes of a PC-based design tool with a communications link to a remote sound processing module. The remote sound processing module, located in the vehicle, processes audio signals from one or more sources including radios, DVD players, and satellite digital radio. The output of the remote sound processing module may drive other signal processing modules or speakers, in which case signal amplification is often employed. The signal processing done by the remote sound processing module can be configured via commands from a PC-based design tool transmitted via a serial-bus interface. The PC-based design tool allows the user to prepare the signal processing parameters for remote sound processing prior to establishing a communications link to the remote sound processing module. The design tool allows the user to customize the processing on each output channel. Processing blocks available to the user include a cross-bar mixer with surround-sound decoded elements, an infinite-impulse-response (IIR) filter bank, time alignment, and speed-dependent gain. The remote sound processing modules may also incorporate one or more virtual channels. A virtual channel is a channel whose output appears on the input vector of the crossbar mixer.

Figure 1:
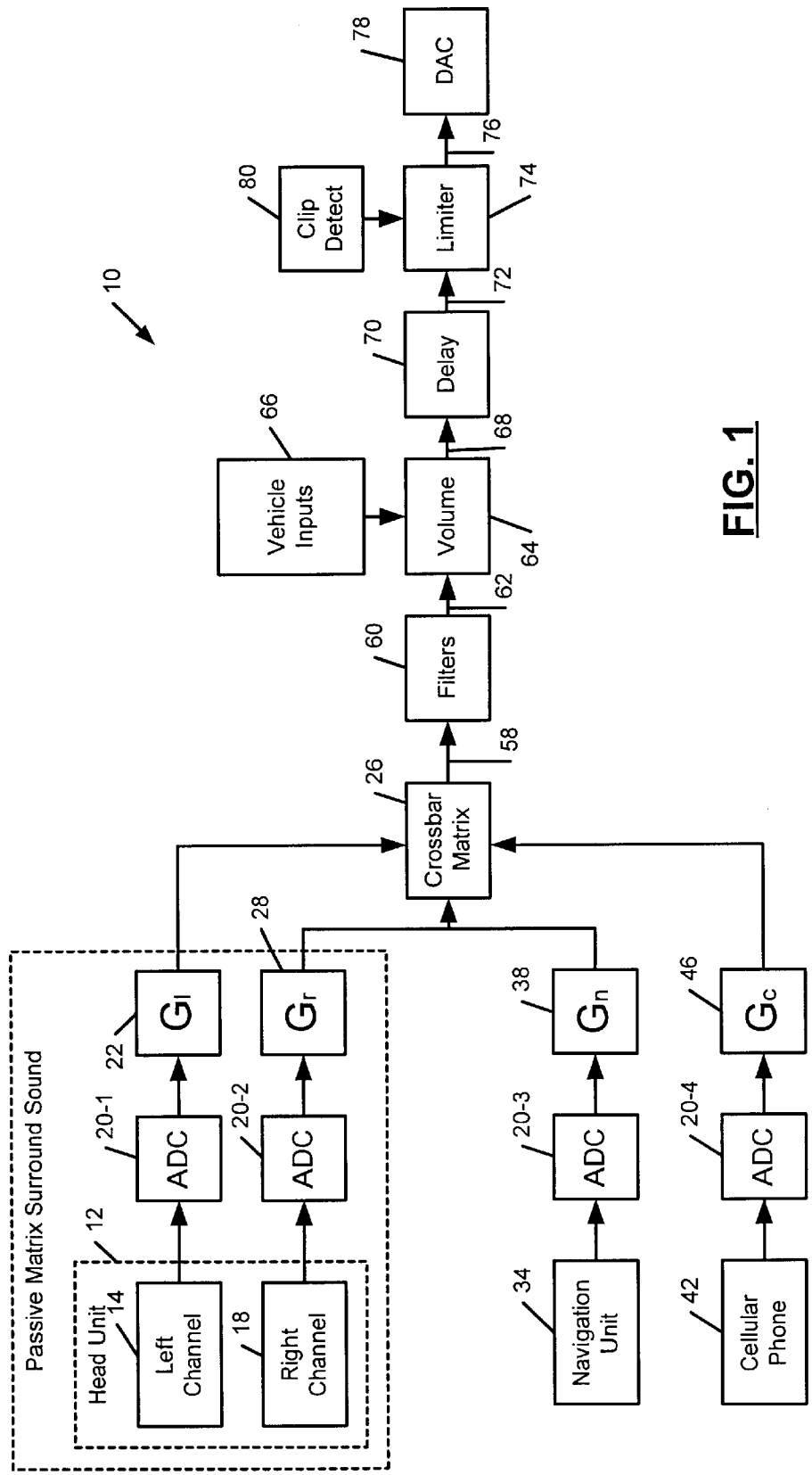
FIG. 1 is a functional block diagram of a first exemplary signal processing system according to the present invention.

Referring now to FIG. 1, an exemplary audio signal processor 10 is illustrated. A head unit 12 generates a left channel 14 and a right channel 18. The left channel 14 is output to an analog to digital converter (ADC) 20-1. A first gain block 22 applies a scaling factor $G_l$ to the digitized left channel. An output of the first gain block 22 is input to a crossbar matrix 26. Likewise, the right channel 18 of the head unit 12 is output to an ADC 20-2. A second gain block 28 applies a scaling factor $G_r$ to the digitized right channel. An output of the second gain block 28 is input to the crossbar matrix 26.

A navigation unit 34 generates an analog output signal that is digitized by an ADC 20-3. A third gain block 38 applies a scaling factor $G_n$ to the digitized navigation audio signal. An output of the third gain block 38 is input to the crossbar matrix 26. A cellular phone 42 generates an analog output signal that is digitized by an ADC 20-4. A fourth gain block 46 applies a scaling factor $G_c$ to the digitized cellular audio signal. An output of the fourth gain block 46 is input to the crossbar matrix 26.

A summed signal 58 is output by the crossbar matrix 26 to a filter block 60. The filter block 60 includes digital filters that provide conventional filter functions such as allpass, lowpass, highpass, bandpass, peak or notch, treble shelving, base shelving and/or other audio filter functions. An output 62 of the filter block 60 is connected to a volume gain block 64. The gain of the volume gain block 64 is determined by vehicle input signals 66. For example, the vehicle input signals 66 preferably include vehicle speed that is provided by a vehicle data bus. The vehicle input signals 66 may also include vehicle state signals such as convertible top up, convertible top down, vehicle started, vehicle stopped, windows up, windows down, etc. Other input signals such as fade, balance, and volume from the head unit 12, the navigation unit 34 and/or the cellular phone are also employed.

An output 68 of the volume gain block 64 is input to a delay block 70. An output 72 of the delay block is input to a limiter 74. An output 76 of the limiter 74 is input to a digital to analog (DAC) converter 78. The limiter 74 may employ a clip detection block 80. The exemplary audio signal processor 10 of FIG. 1 employs passive matrix surround sound to mix N output channels from the left-right audio input channels. In other words, the passive matrix includes matrix coefficients that do not change over time. In a preferred embodiment, N is equal to 5 or 7. When N is equal to 5, the sound vehicle system preferably includes left front, right front, right rear, left rear and center speakers.

Figure 2:
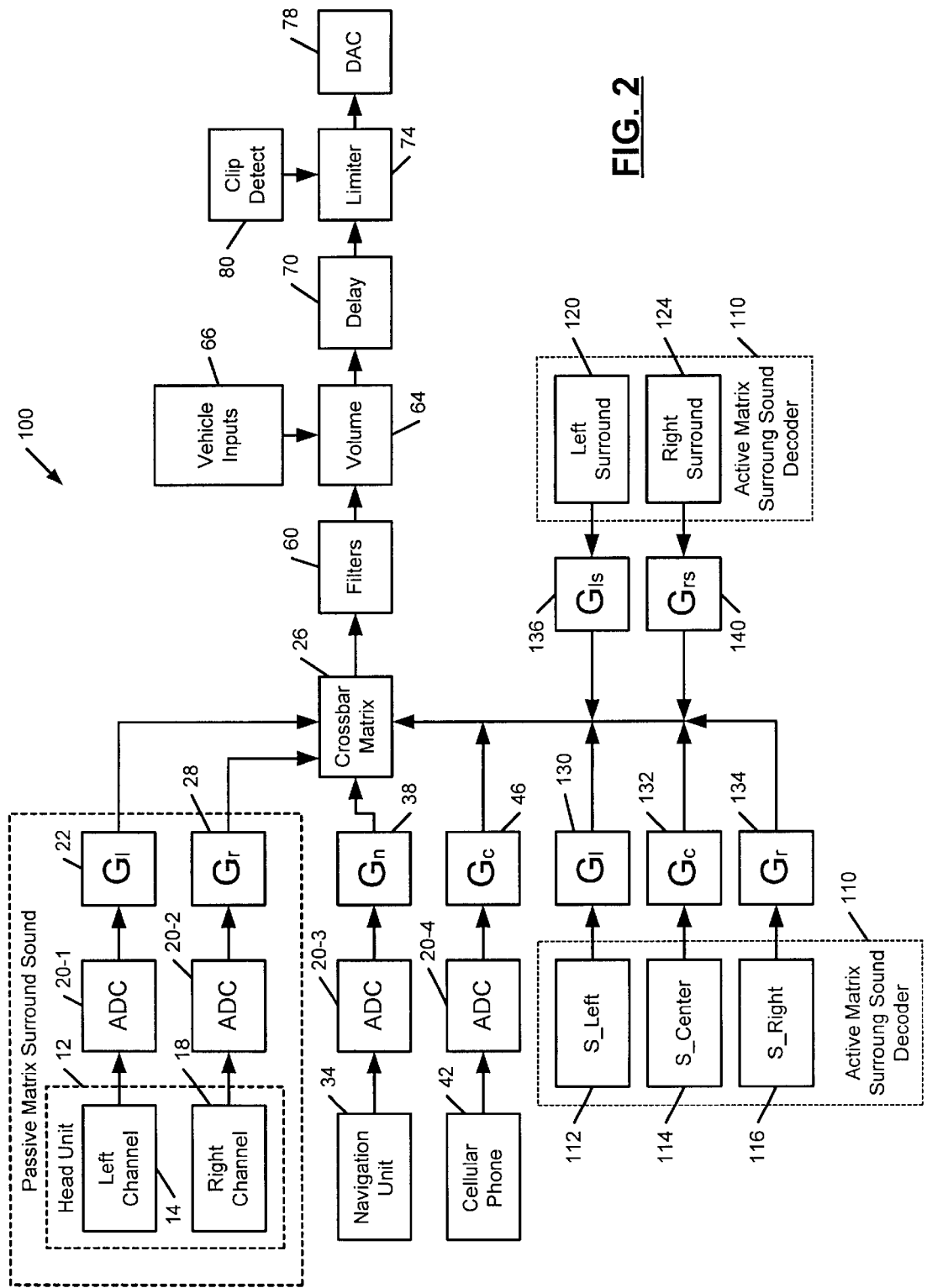
FIG. 2 is a functional block diagram of a second exemplary signal processing system according to the present invention.

Referring now to FIG. 2, an alternate exemplary signal processing system 100 is shown. Reference numbers from FIG. 1 will be used where appropriate to denote similar elements. An active matrix surround sound decoder 110 additionally provides a S_Left channel 112, a S_Center channel 114, a S_Right channel 116, a left surround channel 120, and a right surround channel 124. The matrix coefficients of the active matrix surround sound decoder 110 vary over time. U.S. Pat. Nos. 4,796,844 and 5,870,480 to Greisinger, which are hereby incorporated by reference, disclose a surround sound system that describes the calculation of active matrix coefficients.

The S_Left channel 112 is associated with a fifth gain block 130 having a scaling factor $G_l$. The S_Center channel 114 is associated with a sixth gain block 132 having a scaling factor $G_c$. The S_Right channel 116 is associated with a seventh gain block 134 having a scaling factor $G_r$. The left surround channel 120 is associated with an eighth gain block 136 having a scaling factor $G_{ls}$. The right surround channel 124 is associated with a ninth gain block 140 having a scaling factor $G_{rs}$. Outputs of the gain blocks 22, 28, 38, 46, 130, 132, 134, 136 and 140 are input to the crossbar matrix 26.

Figure 3:
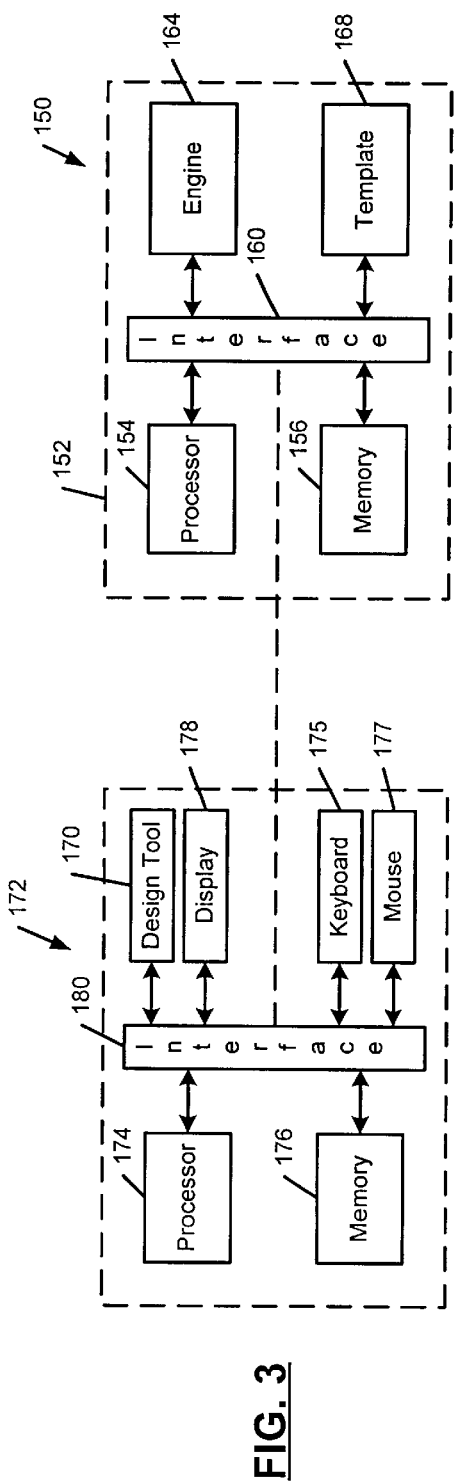
FIG. 3 is a functional block diagram of a signal processing design tool and an audio signal processor.

Referring now to FIG. 3, a functional block diagram illustrates an audio signal processor 150 that preferably forms part of an amplifier 152 that is connected to the head unit 12. The audio signal processor 150 includes a microprocessor 154, memory 156, an input/output (I/O) interface 160, a sound processing and equalization engine 164, and a template file 168. The template file 168 includes input and output channel definitions, filter definitions, gain settings, and other designer-defined criteria as will be described more fully below. The real and virtual inputs and outputs are initially input to the template file using a text editor. Rather than hard-coding filters, gain settings, and other criteria, the audio signal processor 150 obtains the criteria at run-time from the template file 168. In other words, the audio signal processor 150 employs a data-driven architecture. The microprocessor 154 and the sound processing and equalization engine 164 utilize the designer-defined criteria set forth in the template file 168 to customize the audio signal processing and equalization. The memory 156 includes read only memory (ROM), random access memory (RAM), flash memory, and/or other suitable electronic memory. The template file 168 is preferably stored in the memory 156.

The present invention provides a sound processing design tool 170 that includes a graphical software program that is run on a computer 172. The computer 172 includes a microprocessor 174, memory 176 (including RAM, ROM, or other memory), a mouse 177, a display 178, and an I/O interface 180. The sound processing design tool 170 assists a designer with the creation of the template file 168 as will be described below. The template file 168 is used by the sound processing and equalization engine 164 at run-time.

Figure 4:
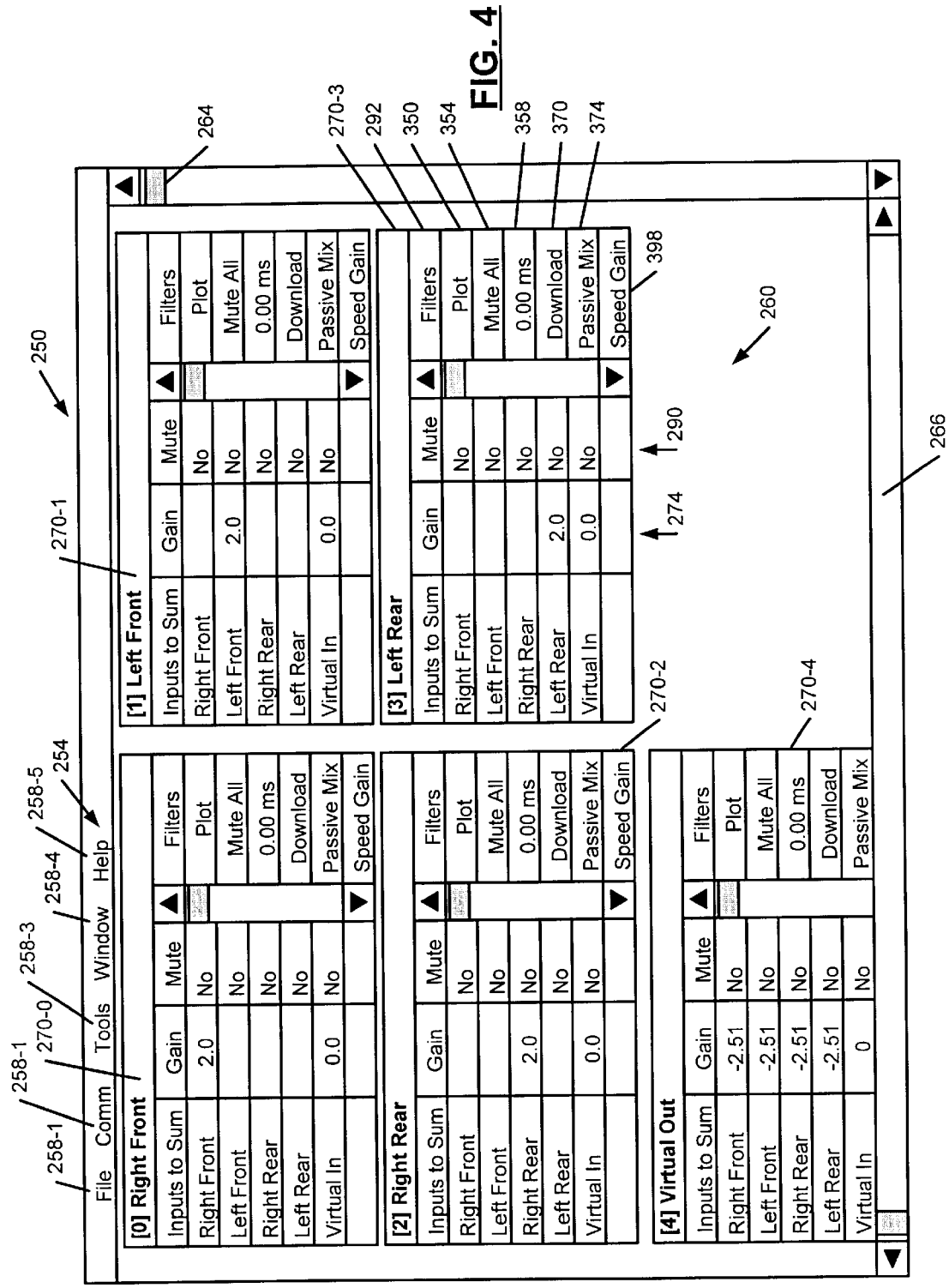
FIG. 4 is a graphical user interface (GUI) for the signal processing design tool according to the present invention.

Referring now to FIG. 4, a graphical user interface (GUI) 250 that is provided by the signal processing design tool 170 is shown. The GUI 250 includes a drop-down menu bar 254 with a plurality of drop-down menu items 258 such as File 258-1, Communications 258-2, Tools 258-3, Window 258-4 and Help 258-5. The designer preferably points and clicks in the GUI 250 using a mouse, a keyboard or any other input device. Objects within the design window 260 are positioned using scroll bars 264 and 266 in a conventional manner. The signal processing design tool 170 provides an output dialog box 270 for each output channel.

In the example depicted in FIG. 4, there are four real inputs and one virtual input. The four real inputs include right front, left front, right rear, left rear channel inputs. There are four real outputs and one virtual output in FIG. 4. The four real outputs include right front, left front, right rear and left rear channel outputs. The virtual channel output in FIG. 4 is defined by a fourth order highpass filter with a center frequency at 20 Hertz, an eighth order lowpass filter with a center frequency at 100 Hertz, and a gain of −2.51 on each of the four input channels. The sound processor depicted in FIG. 4 provides a bass summing function by combining the bass signals from each of the real input channels to form a virtual input channel. Each of the real output channels includes the summed base portions along with the real input signal. For example, the right front output channel includes the right front input channel (with a gain of 2.0) plus the virtual input channel (with a gain of 0.0).

The output dialog boxes 270 allow a designer to set the gain for each of the input channels. For example, the output dialog box 270-3 corresponds to the left rear output channel. Text boxes in a gain setting column 274 allow the designer to set the gain of the input channels for the left rear output channel. Text boxes that are left blank include a −100 dB gain by default. In the example illustrated in FIG. 4, the left rear output channel has a gain of 2.0 for the left rear input channel and a gain of 0.0 for the virtual input channel. When the designer double clicks on a particular text box in the gain setting column 274, a mix dialog box 276 that is depicted in FIG. 5 is launched.

Figure 5:
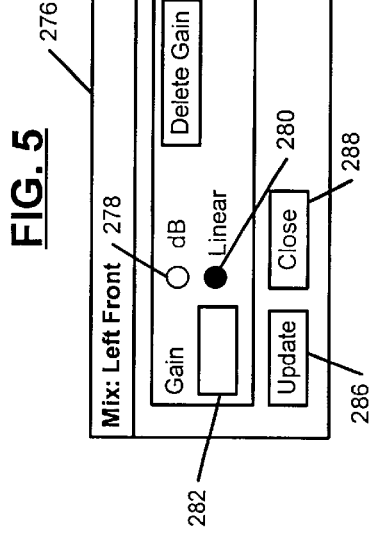
FIG. 5 is a gain setting dialog box of the signal processing design tool of FIG. 4.

Referring now to FIG. 5, the mix dialog box 276 includes first and second radio buttons 278 and 280 that allow a designer to select between decibel (dB) and linear gain settings. The text box 282 allows the designer to input the specific gain setting. A command button 284 allows the designer to delete a gain setting. A command button 286 allows a designer to update the gain setting. A command button 288 allows a designer to close the mix dialog box 276.

Figure 6:
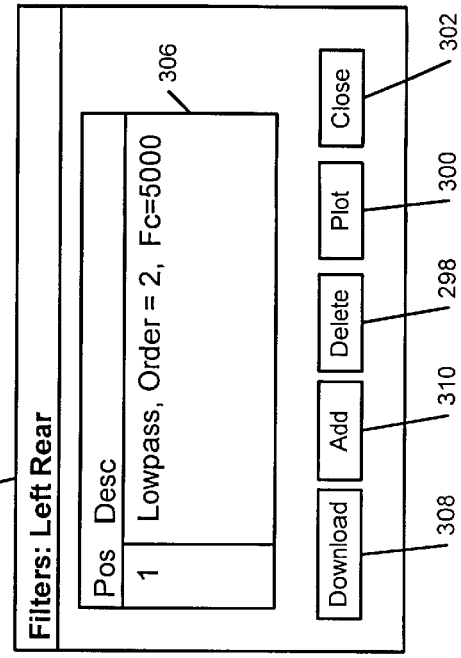
FIG. 6 is a delay setting dialog box of the signal processing design tool of FIG. 4.

Referring to FIGS. 4 and 6, text boxes appearing in a mute column 290 allow the designer to mute one or more input channels. Double-clicking on any of the text boxes in the mute column 290 toggles the mute status of input channel from "Yes" to "No" or "No" to "Yes". When the designer clicks on a filter command box 292, a first filter setting dialog box 294 (that can be seen in FIG. 6) is launched.

Referring now to FIG. 6, the first filter setting dialog box 294 lists filters that are currently set for the output channel and their position. In the example illustrated in FIG. 6, the left rear output channel has a second order low pass filter with a center frequency at 5000 Hz. Additional filters can be added by the designer. Command buttons 298, 300 and 302 allow the designer to delete a filter, plot a filter, and close the first filter setting dialog box 294, respectively. A text box 306 displays the filters currently designated for the output channel and their respective position. A command button 308 allows the designer to download additional filter profiles. A command button 310 allows the designer to launch a second filter setting dialog box 312 (illustrated in FIG. 7) that allows a designer to add a filter to the output channel.

Referring now to FIG. 7, the second filter setting dialog box 314 includes a filter selection frame 316 with a plurality of radio buttons 320 that are associated with a plurality of filter profiles. The filter profiles include allpass, lowpass, highpass, bandpass, peak or notch, treble shelving, and base shelving. Skilled artisans can appreciate that other filter profiles may be added without departing from the spirit of the invention. Text boxes 322, 324, 326, and 328 are associated with filter order, center frequency, gain and Q settings, respectively. As the designer selects from the different filters in the filter selection frame 316, the text boxes 322, 324, 326 and 328 are enabled or disabled depending upon the selected filter profile. For example, if the designer selects a low pass filter, the order and center frequency text boxes 322 and 324 are enabled and the gain and Q text boxes 326 and 328 are disabled. Command button 330 allows a designer to plot the gain response of the filter as a function of frequency in a display frame 332. A command button 340 allows the designer to add the selected filter to the amplifier. A cancel button 342 allows the designer to cancel changes.

Referring back to FIG. 4, a command button 350 allows the designer to plot the response of the output channel as a function of frequency and phase angle so that the developer can review changes that are made. A command button 354 allows the designer to mute all input channels for the output channel or to un-mute all input channels for the output channel. A command button 358 launches a delay dialog box 364 that is illustrated in FIG. 8.

Referring now to FIG. 8, the delay dialog box 364 includes radio buttons 366 and 368 that allow a designer to select the delay based on the number of samples or based on time in milliseconds. Text boxes 372 and 374 allow a designer to enter the delay. Command button 378 allows a designer to update the delay. A command button 388 allows the designer to close the delay dialog box 364.

Figure 9:
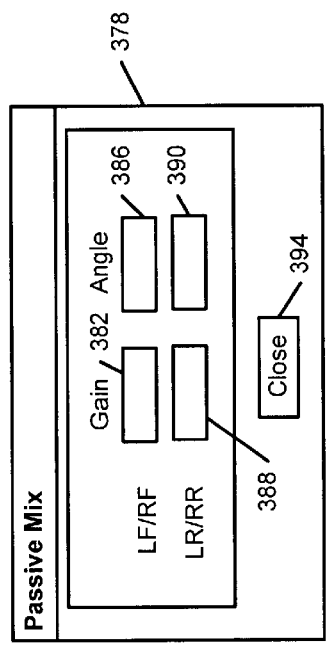
FIG. 9 illustrates one embodiment of a passive mix dialog box.

Referring to FIGS. 4 and 9, a command button 370 allows a designer to send the template file from the computer to the amplifier via an RS232 port. Once the template file is downloaded into the amplifier, the amplifier begins processing the audio stream using the parameters in the template file. A command button 374 launches a passive mix dialog box 378. The passive mix dialog box 378 includes first and second text boxes 382 and 386 that allow the designer to input gain and angle settings for the left front and right front input channels. Third and fourth text boxes 388 and 390 allow the designer to input gain and angle settings for the left rear and right rear input channels. A command button 394 allows the designer to close the passive mix dialog box 378.

Figure 10:
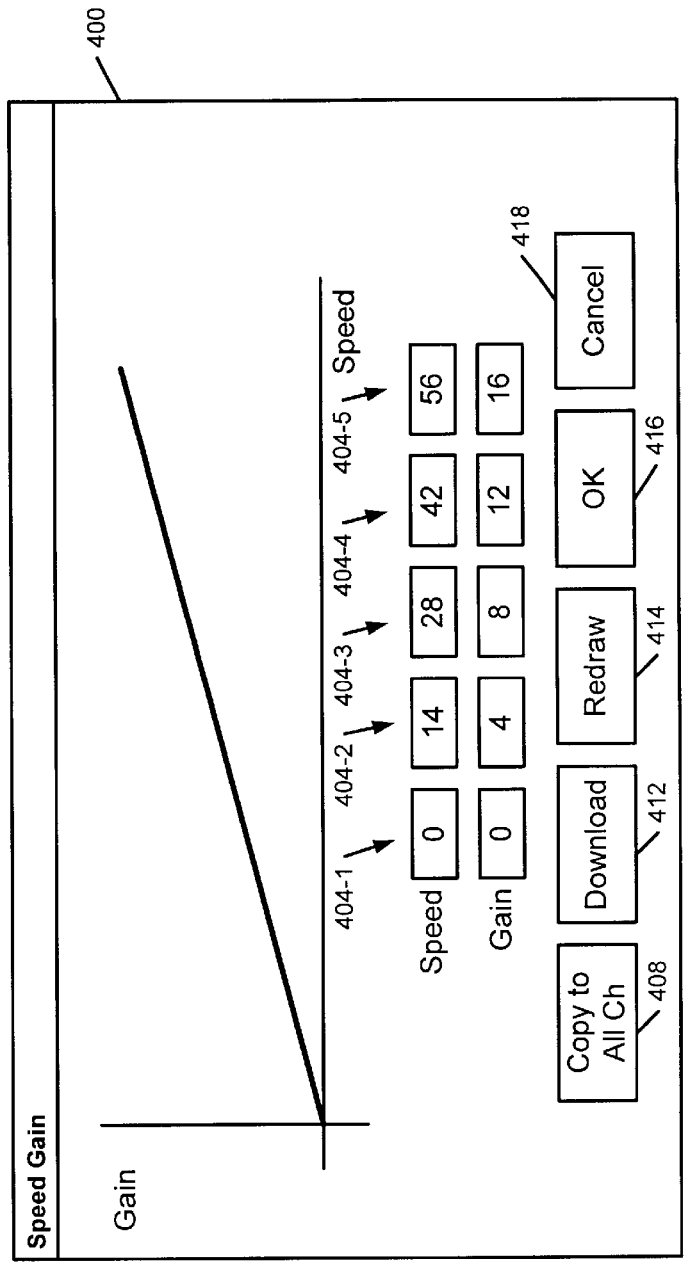
FIG. 10 illustrates one embodiment of a speed gain dialog box.

Referring to FIGS. 4 and 10, a command button 398 launches a speed gain dialog box 400 that allows a designer to set the gain of the output channel as a function of vehicle speed. The speed gain dialog box 400 includes pairs of dialog boxes 404-1, 404-2, 404-3, 404-4, and 404-5 that are associated with individual speed and gain settings. Polynomial line fitting may be employed to smooth the speed/gain function. A command button 408 allows the speed gain settings to be copied to all output channels. A command button 412 allows a designer to download speed gain functions. A command button 414 redraws the speed gain function. Command buttons 416 and 418 approve or cancel changes.

Figure 11:
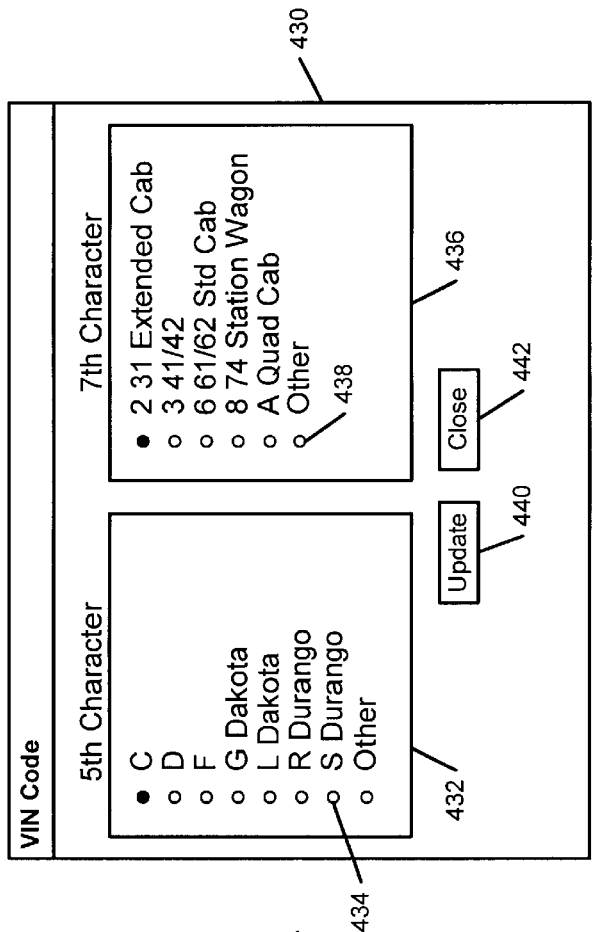
FIG. 11 illustrates one embodiment of a VIN Code dialog box.

When the designer selects Tools 258-3 from the drop-down menu bar 254, various options including VIN (vehicle identification number) Code, Audio Source, Program Flash, Read Only, D.C. Offsets, and Copy Filters options are presented. If the designer selects the VIN Code option, a VIN Code dialog box 430 that is illustrated in FIG. 11 is launched. Referring now to FIG. 11, the first frame 432 includes a plurality of radio buttons 434 that allow a designer to select one of the characters of a VIN code. A second frame 436 allows a designer to select another character of the VIN code using a plurality of radio buttons 438. For example, the first frame 432 allows the designer to select the fifth character of the VIN code that specifies the vehicle model. The second frame 436 allows the designer to select the body style. Command buttons 440 and 442 allow the designer to update or close the VIN Code dialog box 430. The VIN Code dialog box 430 allows the designer to specify that a particular sound processing template applies only to particular vehicle models.

Figure 12:
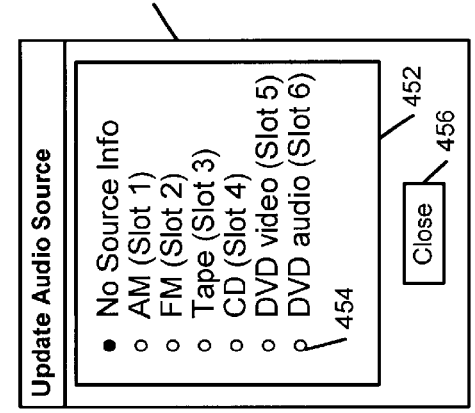
FIG. 12 illustrates one embodiment of an audio source dialog box.

Referring now to FIGS. 4 and 12, when the designer selects the Audio Source option, an audio source dialog box 450 is launched. The audio source dialog box 450 includes a frame 452 that contains radio buttons 454 for selecting the audio source for the template file 168. Selections include no source info, AM, FM, tape, CD, DVD audio, and DVD video. A command button 456 allows a designer to close the audio source dialog box 450.

When the designer selects the Program Flash option on the tool drop-down menu, the user can update core signal processing engine software in the remote signal processing module. When the designer selects the DC Offsets option on the tool drop-down menu, the user can adjust the DC offset voltage output from the amplifier and store the new settings in non-voltage memory in the amplifier.

Figure 13:
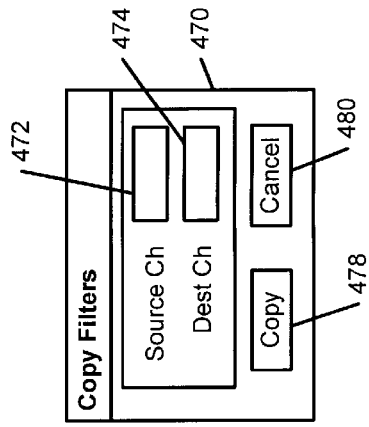
FIG. 13 illustrates one embodiment of a copy filters dialog box.

Referring now to FIGS. 4 and 13, when the designer selects the Copy Filters option on the tool drop-down menu, a copy filters dialog box 470 is launched. The copy filters dialog box 470 includes first and second text boxes 472 and 474 that allow the designer to designate source and destination channels. The source channel is the source for the filters and a destination channel is the destination where the filters are copied. The copy filters dialog box 470 allows the designer to quickly duplicate filters for other channels to expedite the design process. A command button 478 copies filters from the source channel set forth in text box 472 to the destination channel set forth in text box 474. A command button 480 cancels the copy filter operation.

The sound processing design tool creates the template file that contains the designer's settings for the sound processor. The settings are read by the sound processing and equalization engine at run-time and the desired sound processing and equalization is accomplished. Appendix A contains an exemplary template file for a bass summing application. Appendix B illustrates a 4-in, 6-out example with one virtual channel.

Other uses of virtual channels include speed dependent bass boost, tone control and loudness generation. Speed dependent bass boost increases or decreases bass as a function of vehicle speed. Speed dependent tone control varies bass, midrange or treble as a function of speed. Other uses of virtual channels will be apparent to skilled artisans.

As can be appreciated from the foregoing, the sound processing tool according to the present invention employs a data driven architecture that dramatically simplifies the coding of sound processing and equalization for audio systems. The sound processing tool allows a designer to create virtual input and output channels. In addition, the designer can specify the VIN Codes to which the sound processing design applies. The designer can specify different sound processing profiles, filters, gain, etc. for each audio input source. In addition, the designer can easily mix M output channels from N input channels. The straightforward GUI of the sound processing design tool allows designers with less experience and education to define sound processing and equalization for vehicle audio systems.

Those skilled in the art can now appreciate from the foregoing description that the broad teachings of the present invention can be implemented in a variety of forms. Therefore, while this invention has been described in connection with particular examples, thereof, the true scope of the invention should not be so limited since other modifications will become apparent to the skilled practitioner upon a study of the drawings, the specification and the following claims.

Appendix A

Vehicle: EQ0 AN VIRTUAL
VIN: AN_VIRTUAL
Number of Inputs: 5
Input[0]: Left Front
Input[1]: Right Front
Input[2]: Left Back
Input[3]: Right Back
Input[4]: Virtual In
Number of Outputs: 5
Output[0]: Left Front
Output[1]: Right Front
Output[2]: Left Back
Output[3]: Right Back
Output[4]: Virtual Out
SampleRate: 48000
CrossBar[0][0]: 1.258925412
CrossBar[0][1]: 0
CrossBar[0][2]: 0
CrossBar[0][3]: 0
CrossBar[0][4]: 1
CrossBar[1][0]: −0
CrossBar[1][1]: 1.258925412
CrossBar[1][2]: 0
CrossBar[1][3]: 0
CrossBar[1][4]: 1
CrossBar[2][0]: 0
CrossBar[2][1]: 0
CrossBar[2][2]: 1.258925412
CrossBar[2][3]: 0
CrossBar[2][4]: 1
CrossBar[3][0]: 0
CrossBar[3][1]: 0
CrossBar[3][2]: 0
CrossBar[3][3]: 1.244514612
CrossBar[3][4]: 1
CrossBar[4][0]: 0.749005
CrossBar[4][1]: 0.749005
CrossBar[4][2]: 0.749005
CrossBar[4][3]: 0.749005
CrossBar[4][4]: 0
Channel: 0
Number of Filters on Channel: 1
Filter Type: 0=allpass
Fs: 48000
Fc|Fo: 24000
Gain(db): 0
Order: 2
Channel: 1
Number of Filters on Channel: 1

Filter Type: 1=lowpass
Fs: 48000
Fc|Fo: 24000
Gain(db): 0
Order: 2
Channel: 2
Number of Filters on Channel: 1
Filter Type: 0=allpass
Fs: 48000
Fc|Fo: 24000
Gain(db): 0
Order: 2
Channel: 3
Number of Filters on Channel: 2
Filter Type: 1=lowpass
Fs: 48000
Fc|Fo: 24000
Gain(db): 0
Order: 2
Filter Type: 5=bass shelf
Fs: 48000
Fc|Fo: 24000
Gain(db): 0
Order: 2
Q: 3.434271942e-307
Channel: 4
Number of Filters on Channel: 2
Filter Type: 2=highpass
Fs: 48000
Fc|Fo: 20
Gain(db): 0
Order: 4
Filter Type: 1=lowpass
Fs: 48000
Fc|Fo: 100
Gain(db): 0
Order: 8
Samples of delay on channel[0]: 0
Samples of delay on channel[1]: 0
Samples of delay on channel[2]: 0
Samples of delay on channel[3]: 0
Samples of delay on channel[4]: 0
Screen X Coordinate[0]: 0
Screen Y Coordinate[0]: 225
Screen X Coordinate[1]: 0
Screen Y Coordinate[1]: 0
Screen X Coordinate[2]: 250
Screen Y Coordinate[2]: 225
Screen X Coordinate[3]: 250
Screen Y Coordinate[3]: 0
Screen X Coordinate[4]: 500
Screen Y Coordinate[4]: 225
Audio Source (FM, NAV OFF, CELL OFF): 1

APPENDIX B

|         | LF   | RF   | LB   | RB   | Virtual |
|---------|------|------|------|------|---------|
| LF_HI   | 1.0  | 0.0  | 0.0  | 0.0  | 1.0     |
| RF_HI   | 0.0  | 1.0  | 0.0  | 0.0  | 1.0     |
| LF_LO   | 1.0  | 0.0  | 0.0  | 0.0  | 1.0     |
| RF_LO   | 0.0  | 1.0  | 0.0  | 0.0  | 1.0     |
| LB      | 0.0  | 0.0  | 1.0  | 0.0  | 1.0     |
| RB      | 0.0  | 0.0  | 0.0  | 1.0  | 1.0     |
| Virtual | 0.25 | 0.25 | 0.25 | 0.25 | 0.0     |

< <ID_FILTERS> >

| CHANNEL | TYPE | ORDER | FC | GAIN | Q |
|---|---|---|---|---|---|

APPENDIX B-continued

| RF_HI:1 | HIGHPASS | 2 | 500 | 0 | |
| RF_HI:1 | LOWPASS | 2 | 5000 | 0 | |
| RF_LO:3 | BASS_SHELF | 2 | 200 | 2.0 | 2 |
| RF_LO:3 | NOTCH | 2 | 4400 | -2.0 | 2 |
| LF_LO:2 | LOWPASS | 2 | 5000 | 2.0 | 1 |
| RB:5 | TREBLE_SHELF | 2 | 300 | 1.5 | 4 |
| LB:4 | HIGHPASS | 4 | 400 | 0 | |
| Virtual:6 | LOWPASS | 4 | 120 | 0 | |

< <ID_DELAY> >

| CHANNEL | SAMPLES | COMMENT |
|---|---|---|
| 1 | 100 | ~0.0 ms |
| 4 | 200 | ~0.0 ms |

What is claimed is:

1. A digital sound processing design system for a vehicle audio system, comprising:
   a computer; and
   a design tool run by said computer that allows a user to define sound processing criteria in a matrix for first and second real channel inputs of an audio source, wherein said sound processing criteria also define a virtual input channel and a virtual output channel to be part of said matrix,
   said virtual output channel is configurable with said sound processing criteria in said matrix to be partially based on said first and second real input channels,
   said virtual output channel is also configurable with said sound processing criteria in said matrix to be defined as said virtual input channel, wherein said virtual input channel is configurable with said sound processing criteria to be an input to said matrix.

2. The digital sound processing design system of claim 1 further comprising:
   an audio signal processor that is connected to said first and second real channel inputs.

3. The digital sound processing design system of claim 2 wherein said design tool stores said sound processing criteria in a template file.

4. The digital sound processing design system of claim 3, further comprising:
   a sound processing engine that is coupled to said audio signal processor and that reads said template file at run time to obtain said sound processing criteria.

5. The digital sound processing design system of claim 4 further comprising:
   memory that is associated with said audio signal processor and said sound processing engine and that stores said template file, wherein said memory is removably connected to said computer to receive said template file.

6. The digital sound processing design system of claim 5 wherein said memory includes flash memory.

7. The digital sound processing design system of claim 1 wherein said sound processing criteria includes a speed/gain function that varies a gain factor of at least one output channel as a function of vehicle speed.

8. The digital sound processing design system of claim 1 wherein said sound processing criteria includes filter profiles that are applied to one of said first and second real channel inputs.

9. The digital sound processing design system of claim 1 wherein said sound processing criteria includes gain settings that are applied to one of said first and second real channel inputs.

10. The digital sound processing design system of claim 1 wherein said sound processing criteria includes vehicle identification number (VIN) selectors.

11. The digital sound processing design system of claim 1 wherein said sound processing criteria includes audio source selectors.

12. The digital sound processing design system of claim 1 further comprising a channel copier for copying filters from a first channel to a second channel.

13. A sound processing design system for configuring sound processing parameters of a vehicle audio system having a processing block that receives a plurality of real input channels and generates a plurality of real output channels in response to the real input channels, the sound processing design system comprising:
   a processor; and
   a design tool executable by the processor that is configurable to define sound processing criteria for a vehicle audio system, where the design tool comprises:
      a virtual output data set that is transmittable to a processing block in the vehicle audio system, where the virtual output data set is configurable to create a virtual output channel in the processing block as a function of specification of a gain of at least one of a plurality of real input channels to the processing block; and
      a real output data set that is transmittable to the processing block, where the real output data set is configurable to selectively specify in the processing block a gain of each of the real input channels and a gain of the virtual output channel so that the virtual output channel appears as an input of the processing block and is combinable with the real input channels to form a real output channel of the processing block.

14. The sound processing design system of claim 13, where a plurality of available filters are selectable with the design tool to filter the virtual output channel.

15. The sound processing design system of claim 13, where the design tool is configured to indicate filters designated in one of the real output data set and the virtual output data set to filter one of the real output channel and the virtual output channel, respectively, and where the design tool is further configured to provide for designation of an additional filter that is selectable from a plurality of available filters.

16. The sound processing design system of claim 13, where a plurality of available delay settings to delay one of the virtual output channel and the real output channel are selectable with the design tool.

17. The sound processing design system of claim 13, where the virtual output data set is a first virtual output data set and the design tool further includes a second virtual output data set, where the second virtual output data set is configurable to selectively specify a gain of the virtual output channel and the real input channels to create another virtual output channel.

18. The sound processing design system of claims 13, where the virtual output data set is also configurable to specify a filter and a delay for the virtual output channel.

19. The sound processing design system of claim 13, where the real output data set is also configurable to specify a filter and a delay for the real output channel.

20. The sound processing design system of claim 13, where each of the real input channels include one of a plurality of surround sound decoded elements.

21. The sound processing design system of claim 13, where the real input channels include a right channel and a left channel.

22. The sound processing design system of claim 13, where the real output channel includes a plurality of real output channels and the number of real input channels is equal to the number of real output channels.

23. A sound processing design system for configuring sound processing parameters of a vehicle audio system that receives a real input channel and generates a real output channel in response to the real input channel, the sound processing design system comprising:
   a processor;
   a memory in communication with the processor; and
   a design tool storable in the memory and executable by the processor to configure sound processing criteria for a vehicle audio system, where the design tool includes:
      a first set of data inputs configurable to specify a gain setting of a real input channel to form a virtual channel, and
      a second set of data inputs that are different from the first set of data inputs, where the second set of data inputs are configurable to specify a gain setting of the real input channel and a gain setting of the virtual channel,
      the real input channel and the virtual channel to be combined as a function of the second set of data inputs to form only a real output channel.

24. The sound processing design system of claim 23, where the design tool is configured to generate a dataset to modify the gains within a crossbar matrix included in the vehicle audio system, where the dataset is generated as a function of the first and second sets of data inputs.

25. The sound processing design system of claim 23, where the design tool is configurable to generate a different dataset for each of a plurality of audio sources selectable in the vehicle audio system.

26. The sound processing design system of claim 23, where the design tool is configured to calculate the sound processing criteria as a function of the first and second sets of data inputs, the sound processing criteria storable with the design tool as a template file in the memory.

27. The sound processing design system of claim 23, where the design tool is configured to transmit the signal processing criteria to the vehicle audio system to customize signal processing on the real output channel, the signal processing criteria generated as a function of the first and second sets of data inputs.

28. The sound processing design system of claim 23, where the real input channel includes at least two real input channels and the real output channel includes at least eight real output channels.

29. The sound processing design system of claim 23, where the virtual channel includes a plurality of virtual channels generated as a function of the real input channel.

30. The sound processing design system of claim 23, where the real input channel includes a left front channel input, a right front channel input, a left rear channel input and a right rear channel input.

31. The sound processing design system of claim 23, where the real input channel is a plurality of real input channels and the second set of data inputs is configurable to combine at least two of the real input channels to create the virtual channel.

32. The sound processing design system of claim 31, where the second set of data inputs is configurable to combine a portion of the frequency range from each of the at least two real input channels so that virtual channel is representative of a summed frequency range of the real input channels.

33. The sound processing design system of claim 23, where the design tool further includes a speed gain setting that is configurable to set a gain of the real output channel based on a vehicle speed.

34. The sound processing design system of claim 23, where the design tool further includes specification of a dynamic gain setting that is configurable to dynamically set a gain of the real output channel as function of a vehicle input signal.

35. The sound processing design system of claim 34, where polynomial smoothing of the gain setting over a range of the vehicle input signal is configurable with the design tool.

36. The sound processing design system of claim 23, where the real output channel includes a first output channel and a second output channel, and where the design tool is configured to enable copying of data entered for the first output channel to create data for the second output channel.

37. The sound processing design system of claim 23, where the virtual channel is a plurality of virtual channels and the design tool is configured to enable copying data in the second set of data inputs for a first virtual channel to create data in the second set of data inputs for a second virtual channel.

38. The sound processing design system of claim 23, where each of the first and second sets of data inputs includes specification of a linear gain applied to the real input channel.

39. The sound processing design system of claim 23, where each of the first and second sets of data inputs includes specification of a decibel gain applied to the real input channel.

40. The sound processing design system of claim 23, where the design tool is configured to be capable of independently muting each of the real input channel, the virtual channel, and the real output channel without changes to an associated gain setting.

41. The sound processing design system of claim 23, where the design tool is configured to specify a delay of the real output channel.

42. The sound processing design system of claim 23, where the design tool is configured to plot characteristics of a filter that is selectable to filter the real output channel.

43. In a sound processing design system having a graphical user interface that includes a display and an input device, a method of configuring sound processing parameters of a vehicle audio system with the display, the method comprising:
retrieving a design tool graphical user interface;
displaying a real output dialog box and a virtual output dialog box in the design tool graphical user interface;
receiving data in the virtual output dialog box that includes a gain setting of a real input channel;
in response to receipt of the data in the virtual output dialog box, defining a virtual channel based at least in part on the gain setting of the real input channel; and
receiving data in the real output dialog box that sets a gain of the virtual channel and a gain of the real input channel to define the proportion of the virtual channel and the real input channel that are to be mixed to produce a summed signal on a real output channel.

44. The method of claim 43, where receiving data includes displaying a mix dialog box in the design tool graphical user interface in response to selection of a gain setting, the mix dialog box configured to receive a gain setting.

45. The method of claim 44, where the mix dialog box is also configured to select between receipt of a decibel and a linear gain setting.

46. The method of claim 43, further comprising creating a template file that includes the data received in the virtual output dialog box and the real output dialog box.

47. The method of claim 46, further comprising receiving a transmit request from an input device in one of the virtual output dialog box and the real output dialog box and transmitting the template file for receipt by a vehicle audio system in response to the transmit request.

48. The method of claim 43, further comprising receiving a filter command from an input device in the virtual output dialog box for selection of a filter, and in response to the filter command displaying in the design tool graphical user interface a filter setting dialog box indicating filters available to filter the virtual channel.

49. The method of claim 43, further comprising receiving a filter command in the real output dialog box for selection of a filter, and in response to the filter command displaying in the design tool graphical user interface a filter setting dialog box indicating filters available to filter the real channel.

50. The method of claim 49, further comprising receiving a filter-add command and displaying in the design tool graphical user interface a filter-add dialog box in response to the filter-add command.

51. The method of claim 50, further comprising:
receiving a selection of one of a plurality of filter profiles with the filter-add dialog box;
enabling specification of at least two of a filter order, center frequency, gain, and Q settings for the selected filter; and
enabling the selected filter profile to be at least one of added to an output channel and plotted as a gain response for the output channel.

52. The method of claim 43, further comprising receiving a plot command from an input device in one of the virtual output dialog box and the real output dialog box, and in response to the plot command, displaying in the design tool graphical user interface a plot of a response of one of the virtual channel and the real output channel, respectively, as a function of frequency and phase angle.

53. The method of claim 43, further comprising receiving a delay command from an input device, and in response to the delay command, displaying in the design tool graphical user interface a delay selection screen that is enabled to receive a delay value.

54. The method of claim 53, where the delay selection screen is enabled to receive the delay value as a number of samples.

55. The method of claim 53, where the delay selection screen is enabled to receive the delay value as a time.

56. The method of claim 43, further comprising receiving a request for selection of a speed compensation from an input device, and in response to the speed compensation request, displaying in the design tool graphical user interface a speed compensation screen.

57. The method of claim 56, further comprising enabling receipt of a gain of the real output channel and a corresponding vehicle speed in the speed compensation screen.

58. The method of claim 57, where the gain of the real output channel is a plurality of gains and the corresponding vehicle speed is a plurality of corresponding vehicle speeds, further comprising applying polynomial line fitting to smooth a speed-gain function.

59. The method of claim 43, further comprising receiving an audio source selection command in the design tool graphical user interface, and in response to the audio source selection command displaying in the design tool graphical user interface an audio source dialog box with a plurality of audio sources selectable to be associated with the received data.

60. The method of claim 43, further comprising receiving a copy filters command from an input device in the design tool graphical user interface, and in response to the copy filters command displaying in the design tool graphical user interface a copy filters dialog box enabled to receive a source channel and a destination channel, where the source channel is the source for a filter and the destination channel is the destination for the filter to be copied.

61. A sound processing design system for configuring a vehicle audio system to receive a real input channel and generate a real output channel in response to the real input channel, the sound processing design system comprising:

a memory device;

instructions stored in the memory device to generate a design tool graphical user interface displayable on a display;

instructions stored in the memory device to generate a first output dialog box in the design tool graphical user interface, the first output dialog box configurable with a gain setting of a real input channel to create a virtual channel;

instructions stored in the memory device to generate a second output dialog box in the design tool graphical user interface, the second output dialog box configurable with a gain setting for each of the real input channel and the virtual channel; and instructions stored in the memory device to configure a template file that defines a real output channel by the summation of the real input channel and the virtual channel as a function of the respective gain settings configurable with the second output dialog box.

62. The sound processing design system of claim 61, further comprising instructions stored in the memory device to store the configuration of the first and second output dialog boxes as coefficients in the template file.

63. The sound processing design system of claim 62, further comprising instructions stored in the memory device to initiate transmission of the template file for receipt by an audio signal processor to configure a crossbar mixer.

64. The sound processing design system of claim 61, further comprising instructions stored in the memory device to enable association of an audio source with the template file.

65. The sound processing design system of claim 61, further comprising instructions stored in the memory device to generate a filter dialog box in the design tool graphical user interface, the filter dialog box configurable to add and delete a filter profile for one of the virtual channel and the real output channel.

66. The sound processing design system of claim 61, further comprising instructions stored in the memory device to generate a speed gain dialog box in the design tool graphical user interface, the speed gain dialog box configurable to set the gain of the real output channel as a function of a vehicle speed.

67. The sound processing design system of claim 61, where the real output channel comprises a plurality of real output channels and the sound processing design system further comprises instructions stored in the memory device to enable copying of settings that define a filter for a first real output channel to settings that define a filter for a second real output channel.

68. The sound processing design system of claim 61, further comprising instructions stored in the memory device to create another virtual channel as a function of the real input channel and the virtual channel.

69. The sound processing design system of claim 61, where the first output dialog box is configured with the capability to receive a gain setting of the real input channel, the capability to configure a filter for the virtual channel, and the capability to initiate configuration of a delay for the virtual channel.

70. The sound processing design system of claim 61, where the second output dialog box is configured with the capability to receive gain settings of the real input channel and the virtual channel, the capability to configure a filter for the real output channel, and the capability to initiate configuration of a delay for the real output channel.

* * * * *